US009577023B2

(12) United States Patent
Cooney, III et al.

(10) Patent No.: US 9,577,023 B2
(45) Date of Patent: Feb. 21, 2017

(54) METAL WIRES OF A STACKED INDUCTOR

(71) Applicant: GLOBALFOUNDRIES INC., Grand Cayman (KY)

(72) Inventors: Edward C. Cooney, III, Jericho, VT (US); Dinh Dang, Essex Junction, VT (US); David A. DeMuynck, Underhill, VT (US); Sarah A. McTaggart, South Burlington, VT (US); Gary L. Milo, Milton, VT (US); Melissa J. Roma, Burlington, VT (US); Jeffrey L. Thompson, Woodbury, VT (US); Thomas W. Weeks, Morrisville, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 13/909,464

(22) Filed: Jun. 4, 2013

(65) Prior Publication Data
US 2014/0354392 A1    Dec. 4, 2014

(51) Int. Cl.
*H01F 5/00* (2006.01)
*H01L 21/00* (2006.01)
(Continued)

(52) U.S. Cl.
CPC ........... *H01L 28/10* (2013.01); *H01L 23/5227* (2013.01); *H01L 23/5329* (2013.01); *H01L 2924/0002* (2013.01)

(58) Field of Classification Search
CPC .. H01F 57/0006; H01F 27/2804; H01F 5/003; H01F 17/0013; H01F 2017/0086; H01L 2924/30107; H01L 25/645; H01L 23/5227; H01L 28/10; H01L 2924/19042; H05K 1/165; H05K 1/16
(Continued)

(56) References Cited

U.S. PATENT DOCUMENTS 4,785,345 A * 11/1988 Rawls et al. .................. 257/531
5,269,880 A * 12/1993 Jolly ................. H01L 21/02063
148/DIG. 161
(Continued)

FOREIGN PATENT DOCUMENTS

CN    101170091 A    4/2008
CN    101378054 A    3/2009
(Continued)

OTHER PUBLICATIONS

International Search Report and Written Opinion, PCT/IB2014/061853, Date of Mailing Feb. 26, 2015.
(Continued)

*Primary Examiner* — Elvin G Enad
*Assistant Examiner* — Joselito Baisa
(74) *Attorney, Agent, or Firm* — Anthony J. Canale

(57) ABSTRACT

A method including forming a first metal wire in a first dielectric layer, the first metal wire including a first vertical side opposite from a second vertical side; and forming a second metal wire in a second dielectric layer above the first dielectric layer, the second metal wire including a third vertical side opposite from a fourth vertical side, where the first vertical side is laterally offset from the third vertical side by a first predetermined distance, and the second vertical side is laterally offset from the fourth vertical side by a second predetermined distance, where the first metal wire and the second metal wire are in direct contact with one another.

14 Claims, 7 Drawing Sheets

(51) Int. Cl.
*H01L 21/44* (2006.01)
*H01L 21/4763* (2006.01)
*H01L 27/08* (2006.01)
*H01L 49/02* (2006.01)
*H01L 23/522* (2006.01)
*H01L 23/532* (2006.01)

(58) Field of Classification Search
USPC ........ 336/200, 205, 208; 29/602.1; 257/531;
438/381–385, 622, 623, 625, 652
See application file for complete search history.

(56) References Cited

U.S. PATENT DOCUMENTS

| | | | | |
|---|---|---|---|---|
| 5,429,911 A | * | 7/1995 | Togawa | G01D 5/14 430/296 |
| 5,446,311 A | | 8/1995 | Ewen et al. | |
| 5,635,425 A | * | 6/1997 | Chen | H01L 21/3105 257/E21.241 |
| 5,656,849 A | * | 8/1997 | Burghartz | H01L 23/5227 257/528 |
| 5,766,808 A | * | 6/1998 | Linde | G03F 7/0035 257/E21.025 |
| 5,793,272 A | | 8/1998 | Burghartz et al. | |
| 5,884,990 A | | 3/1999 | Burghartz et al. | |
| 5,918,121 A | | 6/1999 | Wen et al. | |
| 5,926,732 A | * | 7/1999 | Matsuura | H01L 21/76807 257/E21.579 |
| 6,100,177 A | * | 8/2000 | Noguchi | H01L 21/76807 257/E21.577 |
| 6,287,931 B1 | * | 9/2001 | Chen | H01L 21/76224 257/E21.022 |
| 6,387,824 B1 | * | 5/2002 | Aoi | H01L 21/02126 257/E21.261 |
| 6,465,340 B1 | * | 10/2002 | Wang | H01L 21/76808 257/E21.579 |
| 6,555,913 B1 | * | 4/2003 | Sasaki | H01F 17/0013 257/773 |
| 6,576,550 B1 | * | 6/2003 | Brase | H01L 21/76808 257/E21.579 |
| 6,620,721 B1 | * | 9/2003 | Lee | H01L 21/76834 257/E23.02 |
| 6,624,516 B2 | * | 9/2003 | Fujisawa | H01L 21/76846 257/751 |
| 6,635,406 B1 | * | 10/2003 | De Leeuw et al. | 430/311 |
| 6,639,298 B2 | * | 10/2003 | Chaudhry | H01L 21/2885 257/531 |
| 6,777,318 B2 | | 8/2004 | Jeng et al. | |
| 7,060,193 B2 | * | 6/2006 | Yelehanka | H01L 21/02109 216/13 |
| 7,129,561 B2 | | 10/2006 | Coolbaugh et al. | |
| 7,372,158 B2 | | 5/2008 | Wang et al. | |
| 7,394,341 B2 | * | 7/2008 | Shimoyama et al. | 336/200 |
| 7,399,696 B2 | | 7/2008 | Coolbaugh et al. | |
| 7,400,025 B2 | * | 7/2008 | Pitts | H01F 17/0013 257/531 |
| 7,846,789 B2 | | 12/2010 | Pendharkar et al. | |
| 7,867,787 B2 | * | 1/2011 | Gardner | H01L 23/5227 257/E21.22 |
| 7,915,166 B1 | * | 3/2011 | Yu | H01L 21/02115 257/E21.17 |
| 8,159,044 B1 | * | 4/2012 | Chen | H01L 23/522 257/516 |
| 8,421,158 B2 | * | 4/2013 | Lin | H01L 21/768 257/379 |
| 8,609,181 B2 | * | 12/2013 | Yamazaki | H01L 27/3276 427/66 |
| 8,610,578 B2 | * | 12/2013 | Hashimoto | 340/572.7 |
| 8,809,144 B2 | * | 8/2014 | Daley | H01L 23/5223 438/238 |
| 8,860,544 B2 | * | 10/2014 | Ko | H01L 23/5227 336/200 |
| 2003/0096461 A1 | | 5/2003 | Hshieh et al. | |
| 2003/0186541 A1 | | 10/2003 | Liou et al. | |
| 2005/0104157 A1 | | 5/2005 | Coolbaugh et al. | |
| 2005/0142793 A1 | | 6/2005 | Choi et al. | |
| 2009/0057824 A1 | * | 3/2009 | Kwak | H01L 21/7682 257/531 |
| 2009/0146253 A1 | * | 6/2009 | Yun | H01L 23/5227 257/531 |
| 2012/0217641 A1 | | 8/2012 | Chen et al. | |
| 2012/0273956 A1 | | 11/2012 | Watanabe | |
| 2013/0015581 A1 | * | 1/2013 | Wann | H01L 23/53276 257/751 |

FOREIGN PATENT DOCUMENTS

| | | |
|---|---|---|
| EP | 2175487 A2 | 4/2010 |
| KR | 20090020243 A | 2/2009 |
| WO | 0199184 A2 | 12/2001 |
| WO | 03046956 A1 | 6/2003 |
| WO | 2005074402 A2 | 8/2005 |

OTHER PUBLICATIONS

PCT International Preliminary Report on Patentabiliity, International Application No. PCT/IB2014/061853, Dated Dec. 8, 2015, pp. 1-4.

* cited by examiner

METAL WIRES OF A STACKED INDUCTOR

BACKGROUND

The present invention generally relates to semiconductor device manufacturing, and more particularly to the fabrication of stacked metal wires of an inductor.

Miniaturization of electronic circuits is a goal in virtually every field, not only to achieve high density in mechanical packaging, but also to decrease the manufacturing costs of the circuits. Many digital and analog circuits, including complex microprocessors and operational amplifiers, have been successfully implemented in silicon based integrated circuits (ICs). These circuits typically include active devices, such as bipolar transistors and field effect transistors (FETs), diodes of various types, and passive devices, such as resistors and capacitors.

One area that remains a challenge to miniaturize is radio frequency (RF) circuits, such as those used in cellular telephones, wireless modems, and other types of communication equipment. The problem is the difficulty in producing a good inductor in silicon technologies that is suitable for RF applications. Attempts to integrate inductors into silicon technologies have yielded either inductor Q values less than five or required special metallization layers such as gold. The Q value of an inductor may equal the efficiency of the inductor divided by the losses of the inductor.

It is well known that the direct current (DC) resistance of a metal line that forms a spiral inductor is a major contributor to the inductor Q degradation. One way to reduce this effect is to use wide metal line-widths, however, this increases the inductor area and the parasitic capacitance associated with the structure. The larger inductor area limits the miniaturization that can be achieved, and the parasitic capacitance associated with the larger area decreases the self-resonance frequency of the inductor, thereby limiting its useful frequency range. Also, since the Q is directly proportional to frequency and inversely proportional to the series loss of the inductor, the metal line widths cannot be arbitrarily large.

One approach may include fabricating an inductor in which multiple metal wires are stacked vertically to achieve desired Q values. Optimally, the multiple metal wires would all be of an equal width and would be aligned perfectly one on top of the other; however, due to fabrication constraints and current processing capabilities or limitations there exist some misalignment between one metal wire stacked above another metal wire. The misalignment between adjacent metal wires may yield performance and reliability issues due to cracking at or near an intersection between adjacent metal wires.

Therefore, it may be desirable, among other things, to overcome the deficiencies described above.

SUMMARY

According to one embodiment of the present invention, a method is provided. The method may include forming a first metal wire in a first dielectric layer, the first metal wire comprising a first vertical side opposite from a second vertical side; and forming a second metal wire in a second dielectric layer above the first dielectric layer, the second metal wire comprising a third vertical side opposite from a fourth vertical side, wherein the first vertical side is laterally offset from the third vertical side by a first predetermined distance, and the second vertical side is laterally offset from the fourth vertical side by a second predetermined distance, wherein the first metal wire and the second metal wire are in direct contact with one another.

According to another exemplary embodiment, a structure is provided. The structure may include a first metal wire in a first dielectric layer, the first metal wire comprising a first vertical side opposite from a second vertical side; and a second metal wire in a second dielectric layer above the first dielectric layer, the second metal wire comprising a third vertical side opposite from a fourth vertical side, wherein the first vertical side is laterally offset from the third vertical side, and the second vertical side is laterally offset from the fourth vertical side, wherein the first metal wire and the second metal wire are in direct contact with one another.

According to another exemplary embodiment, a design structure tangibly embodied in a machine readable medium for designing, manufacturing, or testing an integrated circuit is provided. The design structure may include a first metal wire in a first dielectric layer, the first metal wire comprising a first vertical side opposite from a second vertical side; and a second metal wire in a second dielectric layer above the first dielectric layer, the second metal wire comprising a third vertical side opposite from a fourth vertical side, wherein the first vertical side is offset from the third vertical side by at least approximately 0.6 µm, and the second vertical side is offset from the fourth vertical side by at least approximately 0.6 µm, wherein the first metal wire and the second metal wire are in direct contact with one another.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which:

FIG. 1 is a cross section view illustrating the formation of a first inductor level above a lower wiring level according to an exemplary embodiment.

FIG. 2 is a cross section view illustrating the formation of a trench in a second inductor level above the first inductor level according to an exemplary embodiment.

FIG. 3 is a cross section view illustrating the formation of a second metal wire and the final structure according to an exemplary embodiment.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

The embodiments of the present invention generally relates semiconductor device manufacturing, and more particularly to the fabrication of a high performance metal stacked inductor in which one or more metal wires may be stacked one on top of another. In one embodiment, an underlying metal wire may be wider than a subsequently formed metal wire to specifically address the issues of cracking described above. In another embodiment, an underlying metal wire may be narrower than a subsequently formed metal wire for the same reasons. Moreover, the drawings associated with embodiments of the present invention only illustrate an inductor area of a structure. Other areas, such as wiring or metallization areas can lie to the periphery of the inductor area shown.

Advantageously, the formation of the inductor of the present invention can be implemented in the back-end-of-line (BEOL), and is compatible with current process flows. Thus, known BEOL fabrication techniques may generally be used to fabricate the stacked metal wires. The BEOL may be distinguished from the front-end-of-line (FEOL) in that semiconductor devices, for example transistors, may be fabricated in the FEOL while the connections to and between those semiconductor devices may be formed in the BEOL. The embodiments of the present invention thus allow the stacked metal wires to be fabricated during normal interconnect process flows, thus advantageously reducing processing costs for manufacturing of improved inductors.

Ideally, higher efficiency and increased capabilities are preferable of any inductor. One way to achieve improved reliability and high efficiency within a small footprint may include forming an inductor having stacked metal wires which are offset from one another. An embodiment by which to fabricate stacked metal wires offset from one another is described in detail below by referring to the accompanying drawings FIGS. 1-3. In the present embodiment, two metal wires may be fabricated, one on top of another, in which the sides of the upper metal wire are offset from the sides of the lower metal wire such that the upper metal wire is narrower than the lower metal wire.

Figure 1:
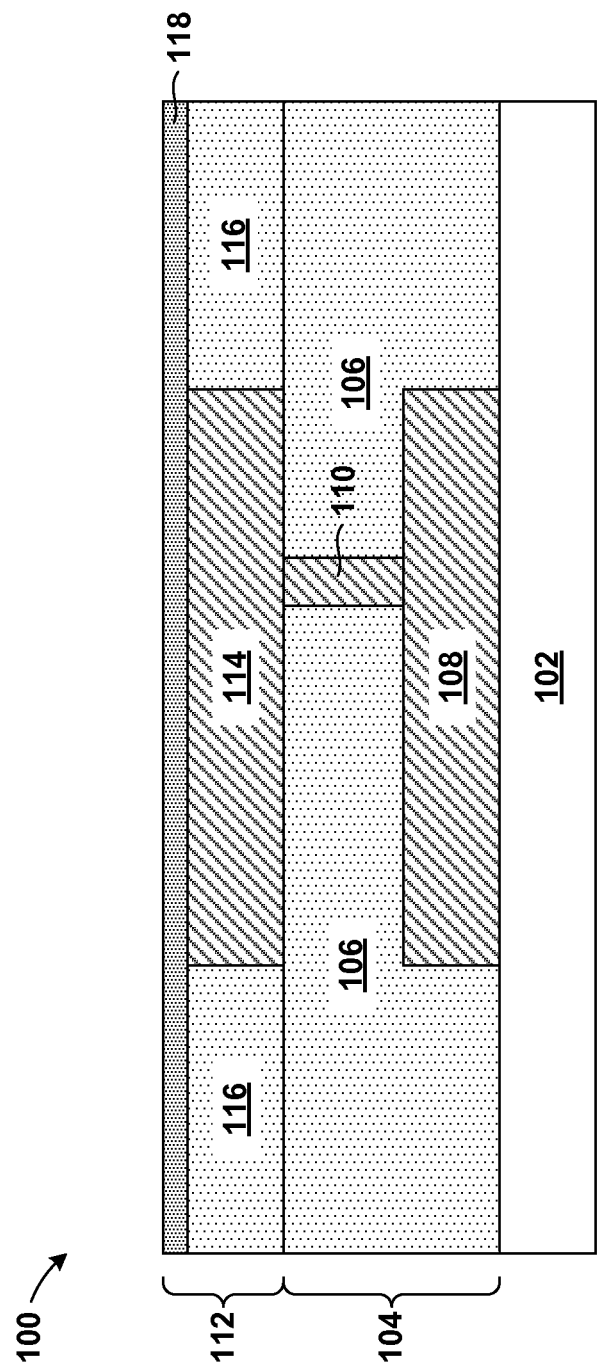
FIGS. 1-3 illustrate the steps of a method of forming an inductor according to an exemplary embodiment.

Referring now to FIG. 1, a structure 100 is shown. The structure 100 may include a substrate 102 and a lower wiring level 104. The lower wiring level 104 may include an interconnect structure having a dielectric layer 106 with a lower wire 108 and a via 110 embedded therein. The substrate 102 may include a bulk semiconductor or a layered semiconductor such as Si/SiGe, a silicon-on-insulator (SOI), or a SiGe-on-insulator (SGOI). Bulk substrate materials may include undoped Si, n-doped Si, p-doped Si, single crystal Si, polycrystalline Si, amorphous Si, Ge, SiGe, SiC, SiGeC, Ga, GaAs, InAs, InP and all other III/V or II/VI compound semiconductors.

When the substrate 102 includes an insulator, the insulator may include any inorganic or organic dielectric material. The insulator can be porous or non-porous and may have a low dielectric constant (less than 4.0) or a high dielectric constant (4.0 or greater). Illustrative examples of insulators that can be used in the substrate 102 can include, but are not limited to: oxides such as $SiO_2$, $Al_2O_3$, $HfO_2$, $ZrO_2$, and perovskite oxides, nitrides, oxynitrides, polyimides, polyimines, Si-containing polymers, or low-k dielectric constant materials such as SILK.

The dielectric layer 106 may be deposited above the substrate 102 using a conventional deposition process such as, for example, spin-on coating, chemical vapor deposition (CVD), plasma-enhanced CVD, evaporation or other like deposition process. The thickness of the dielectric layer 106 after deposition may vary and is not critical to the various embodiments of the present invention.

The dielectric layer 106 may include any suitable dielectric material, for example, silicon oxide ($SiO_2$), silicon nitride ($Si_3N_4$), hydrogenated silicon carbon oxide (SiCOH), silicon based low-k dielectrics, or porous dielectrics. Known suitable deposition techniques, such as, for example, atomic layer deposition, chemical vapor deposition, or physical vapor deposition may be used to form the dielectric layer 106. The dielectric layer 106 may have a thickness ranging from about 0.5 μm to about 8 μm.

Next, the dielectric layer 106 may be patterned by lithography and etching to form the lower wire 108 and the via 110. In either case, a trench or opening may first be patterned into the dielectric layer 106, after which the trench or opening may be filled with a conductive material such as W, Al, Cu and the like by a conventional deposition process. It should be noted that multiple lithography steps may be used to form both the lower wire 108 and the via 110. More specifically, the lower wire 108 may be formed first, and the via 110 may be formed second directly above the lower wire 108. If needed, the structure 100 can be planarized at this point of the present invention by utilizing a conventional planarization process such as chemical mechanical polishing or grinding.

With continued reference to FIG. 1, a first inductor level 112 may be formed directly above the lower wiring level 104. The first inductor level 112 may include a first metal wire 114 formed in a first dielectric layer 116, and a first cap dielectric 118. The first inductor level 112 may generally be similar to any interconnect level in the structure 100. The first metal wire 114 may be similar to a typical line or wire found in a typical semiconductor circuit, for example the lower wire 108.

The first dielectric layer 116 may be substantially similar to the dielectric layer 106, described in detail above. In one embodiment, the first dielectric layer 116 may have a thickness ranging from about 0.5 μm to about 8 μm.

The first metal wire 114 may be formed in the first dielectric layer 116 in accordance with typical lithography techniques. The first metal wire 114 may be fabricated using, for example, a typical single damascene technique in which a conductive interconnect material may be deposited in a trench formed in the first dielectric layer 116. The trench may be formed using any suitable masking and etching technique known in the art. In one embodiment, a dry etching technique using a fluorine based etchant, such as, for example $C_xF_y$, may be used to form the trench in the first dielectric layer 116. Next, a conductive interconnect material may be deposited within the trench and above the first dielectric layer 116. Any known filling technique such as electroplating, electroless plating, chemical vapor deposition, physical vapor deposition or a combination of methods may be used to deposit the conductive interconnect material within the trench. The first metal wire 114, may include any metal suitable for interconnect structures, such as, for example, copper, aluminum, or tungsten.

A seed layer (not shown) may first be deposited within the trench in instances where a plating technique is used to form the first metal wire 114. The seed layer may include any suitable conductive interconnect material similar to that used in the formation of the first metal wire 114. In one embodiment, the first metal wire 114 may include various barrier liners (not shown). The barrier liner may separate the conductive interconnect material of the first metal wire 114 from the first dielectric layer 116. One barrier liner may include, for example, tantalum nitride (TaN), followed by an additional layer including tantalum (Ta). Other barrier liners may include cobalt (Co), or ruthenium (Ru) either alone or in combination with any other suitable liner.

In one embodiment, the first metal wire 114 may include copper deposited using a chemical vapor deposition technique. In the present embodiment, copper may be chosen for easy integration into typical BEOL process flows. The first metal wire 114 may have a thickness similar to that of the dielectric layer 106 above.

Like above, a chemical mechanical polishing technique may be applied to remove excess conductive interconnect material prior to depositing the first cap dielectric 118 above the first metal wire 114 and above the first dielectric 116. The chemical mechanical polishing technique may polish the structure 100 selective to the first dielectric layer 116. The first cap dielectric 118 may electrically insulate the first inductor level 112 from additional inductor levels (not shown) that may be subsequently formed above the first inductor level 112. The first cap dielectric 118 may be deposited using typical deposition techniques, for example, chemical vapor deposition. The first cap dielectric 118 may include, for example, silicon nitride ($Si_3N_4$), silicon carbide (SiC), silicon carbon nitride (SiCN), hydrogenated silicon carbide (SiCH), or other known capping materials. The first cap dielectric 118 may have a thickness ranging from about 20 nm to about 100 nm and ranges there between, although a thickness less than 20 nm and greater than 100 nm may be acceptable.

The first metal wire 114 may generally represent any metal wire in a series of stacked metal wires used to form an inductor; however, in the present embodiment, the first metal wire 114 represents the lowermost metal wire. It should be noted that the fabrication techniques described above may be used to manufacture any metal wire in the stack of metal wires. Furthermore, the first metal wire 114 is illustrated as having a similar thickness as the first dielectric layer 116 which may by typical of most metal wires in the stack. As shown, the first metal wire 114 is in direct contact with the via 110 of the lower wiring level 104.

Figure 2:
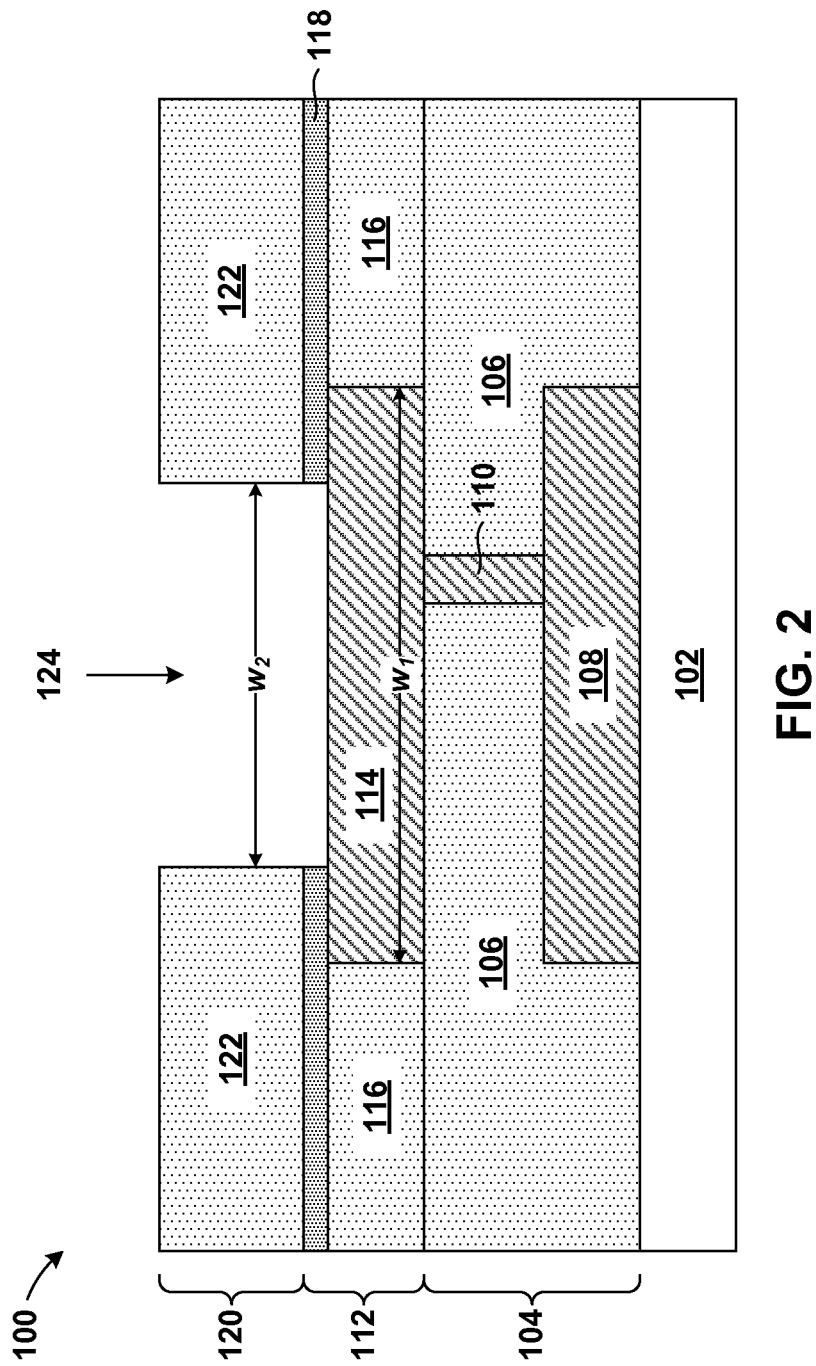
Figure 3:
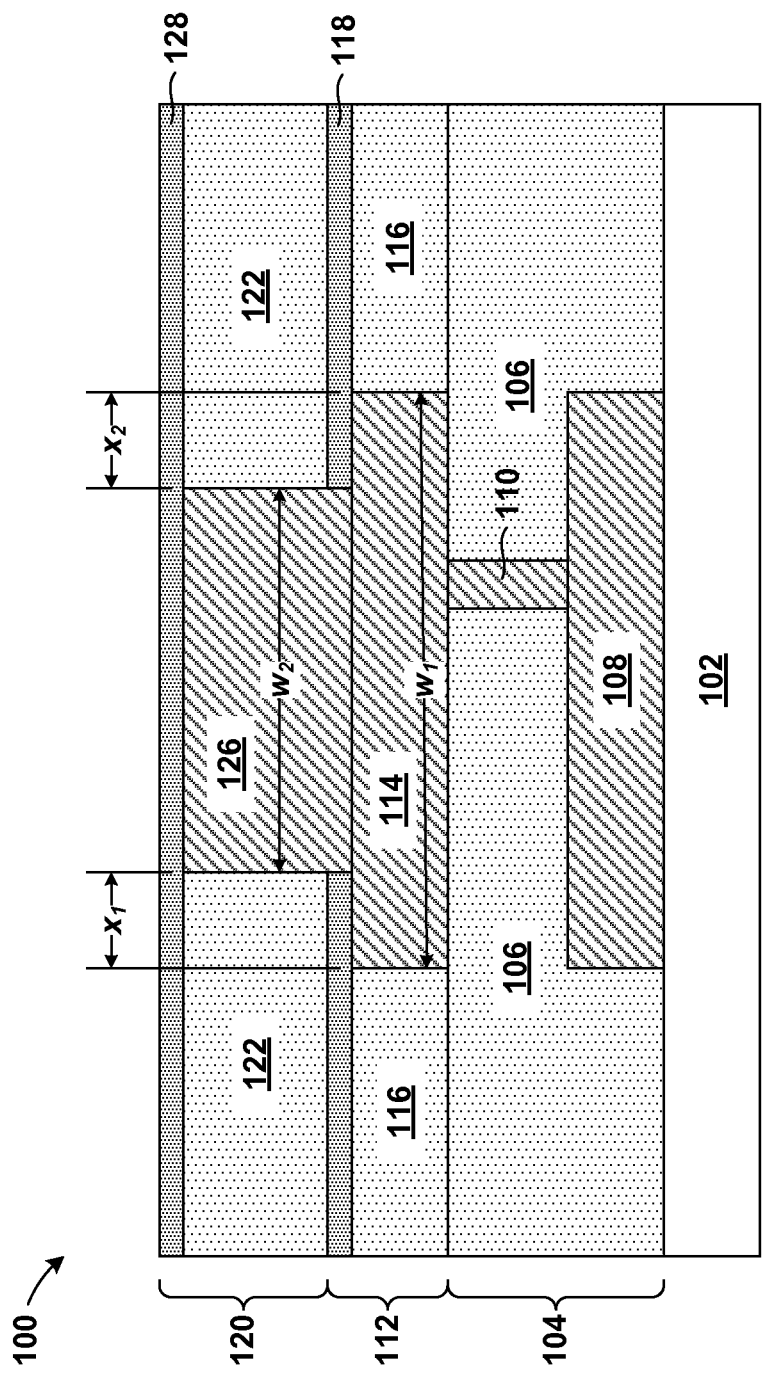

Referring now to FIG. 2, a second inductor level 120 may be fabricated above the first inductor lever 112. The second inductor level 120 may include a second metal wire 126 (FIG. 3) formed in a second dielectric layer 122, and a second cap dielectric 128 (FIG. 3). First, the second dielectric layer 122 may be deposited above the first cap dielectric 118. The second dielectric layer 122 may be substantially similar to the first dielectric layer 116. In one embodiment, the second dielectric layer 122 may have a thickness ranging from about 0.5 μm to about 8 μm.

Like the first metal wire 114 above, a second metal wire may be formed in the second dielectric layer 122 in accordance with typical lithography techniques. A trench 124 may be formed in the second dielectric layer 122. In one embodiment, as shown, the trench 124 may have a width ($w_2$) less than a width ($w_1$) of the first metal wire 114. In another embodiment, the trench 124 may have a width ($w_2$) greater than a width ($w_1$) of the first metal wire 114, as illustrated in the final structure depicted in FIG. 4. In yet another embodiment, the width ($w_1$) of the first metal wire 114 may be substantially similar to the width ($w_2$) of the second metal wire 126, as illustrated in the final structure depicted in FIG. 5.

The trench 124 may be formed using any suitable masking and etching technique known in the art, like above. Formation of the trench 124 may preferably remove a portion of the cap dielectric 118 and expose a portion of the first metal wire 114. The second dielectric layer 122 and the first cap dielectric 118 may be etched either together using a single etching technique or individually using two separate etching techniques. In the present embodiment, a portion of the first cap dielectric 118 may remain above a portion of the first metal wire 114. Such configurations may be susceptible to failure caused by delamination at the interface between the first cap dielectric 118 and the first metal wire 114.

Referring now to FIG. 3, the trench 124 (FIG. 2) may subsequently be filled with an interconnect material to form a second metal wire 126. Similar fabrication techniques as described above with reference to the formation of the first metal wire 114 may be used to form the second metal wire 124. Furthermore, the second metal wire 126 may also optionally include a seed layer or a barrier layer, or both.

Like above, a chemical mechanical polishing technique may be applied to remove excess conductive interconnect material prior to depositing a second cap dielectric 128 above the second metal wire 126 and above the second dielectric layer 122. The second cap dielectric 128 may electrically insulate the second inductor level 120 from additional inductor levels (not shown) that may be subsequently formed above the second inductor level 120. The second cap dielectric 128 may be substantially similar to the first cap dielectric 118 and may be deposited using a similar technique.

In one embodiment, a typical width of either the first or second metal wires 114, 126, for example ($w_1$) or ($w_2$), may range from about 2 μm to about 50 μm. It should be noted however, that the width ($w_1$) of the first metal wire 114 may be different than the width ($w_2$) of the second metal wire 126 due to the offset distance described above.

The structure 100 illustrated in FIG. 3 represents the final structure 100 according to one embodiment. The stacked metal wires, for example the first and second metal wires 114, 126, may together form a single thicker wire which may be implemented to improve the efficiency and capabilities of an inductor. As described above, the first and second metal wires 114, 126 may represent any two metal wires in the stack of metal wires of an inductor. In the present embodiment, the vertical sides of the second metal wire 126 may be offset from the vertical sides of the first metal wire 114 by a predetermined distance ($x_1$, $x_2$) such that the second metal wire 126 is narrower than the first metal wire 114. In one embodiment, the offset distances ($x_1$, $x_2$) may be at least 0.6 μm. It should be noted that the offset distance ($x_1$) may or may not be equal to the offset distance ($x_2$). In the present embodiment, a portion of the second dielectric layer 122 and the first cap dielectric 118 may remain above the first metal wire 114 as a result of the offset described above. The risk of failure due to cracking may be reduced or eliminated by offsetting the vertical sides of the upper wire, for example the second metal wire 126, from the vertical sides of the lower wire, for example the first metal wire 114.

In one embodiment, the first and second dielectric layers 116, 122 may have different thickness, for example, the first metal wire 114 may preferably be thinner than the second metal wire 126. More specifically, for example, the first dielectric layer 116 may have a thickness ranging from about 0.5 μm to about 4 μm, and the second dielectric layer 122 may have a thickness ranging from about 3 μm to about 8 μm. Therefore, the first and second metal wires 114, 126 may also have different thicknesses which may correspond to the thicknesses of the first and second dielectric layers 116, 122.

Figure 4:
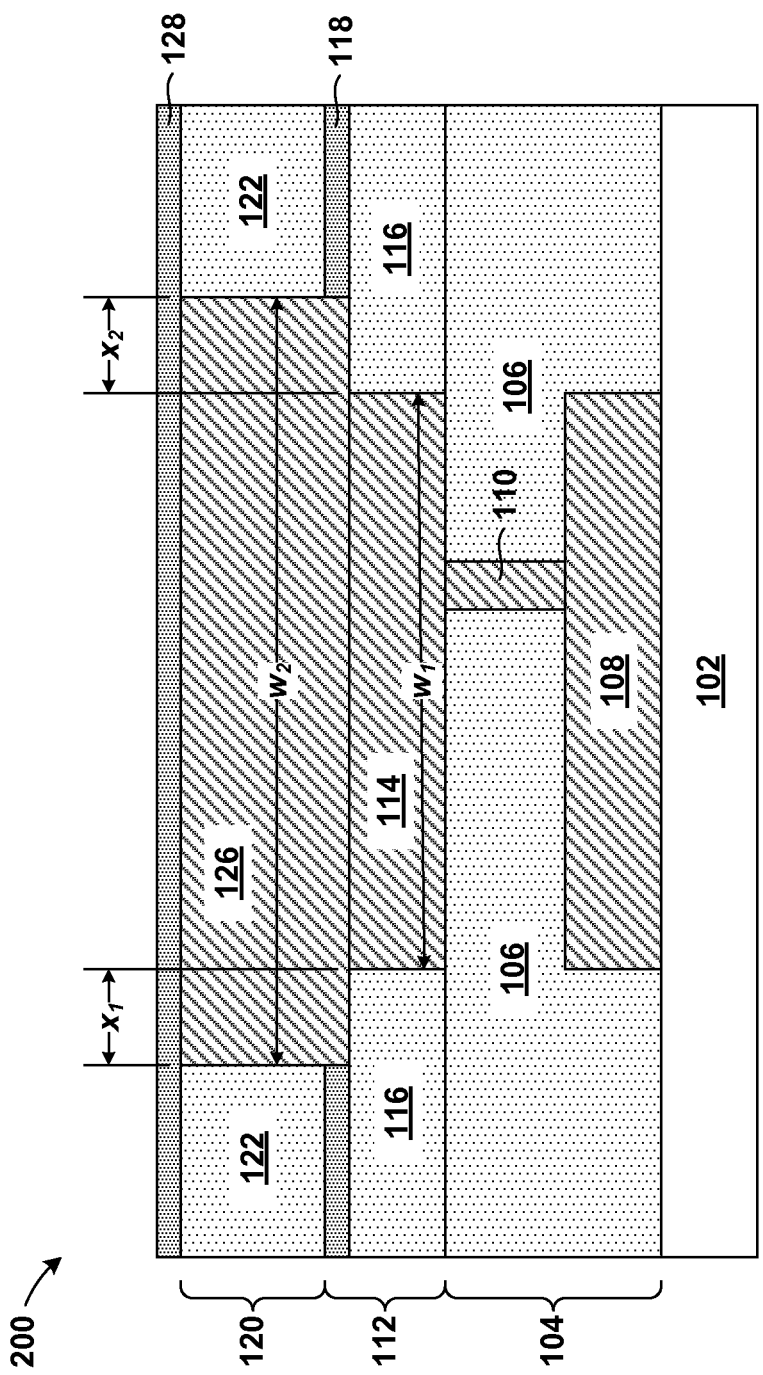
FIG. 4 is a cross section view illustrating a final structure according to another exemplary embodiment.

Referring now to FIG. 4, a final structure 200 is shown according to another embodiment. The structure 200 may be substantially similar in all respects to the structure 100 described in detail above; however, in the present embodiment, the sides of the upper metal wire are offset from the sides of the lower metal wire such that the upper metal wire is wider than the lower metal wire.

In the present embodiment, the vertical sides of the second metal wire 126 may be offset from the vertical sides of the first metal wire 114 by a predetermined distance ($x_1$, $x_2$), as described above. Unlike the previously described embodiment, the second metal wire 126 may extend above a portion of the first dielectric layer 116 as a result of the offset described above. Again, the potential for cracking and failure is reduced by offsetting the vertical sidewalls of two adjacent metal wires stacked one on top of the other. The present embodiment further reduces the risk of cracking, and this failure, by eliminating the interface between the first cap dielectric 118 and the first metal wire 114.

Figure 5:
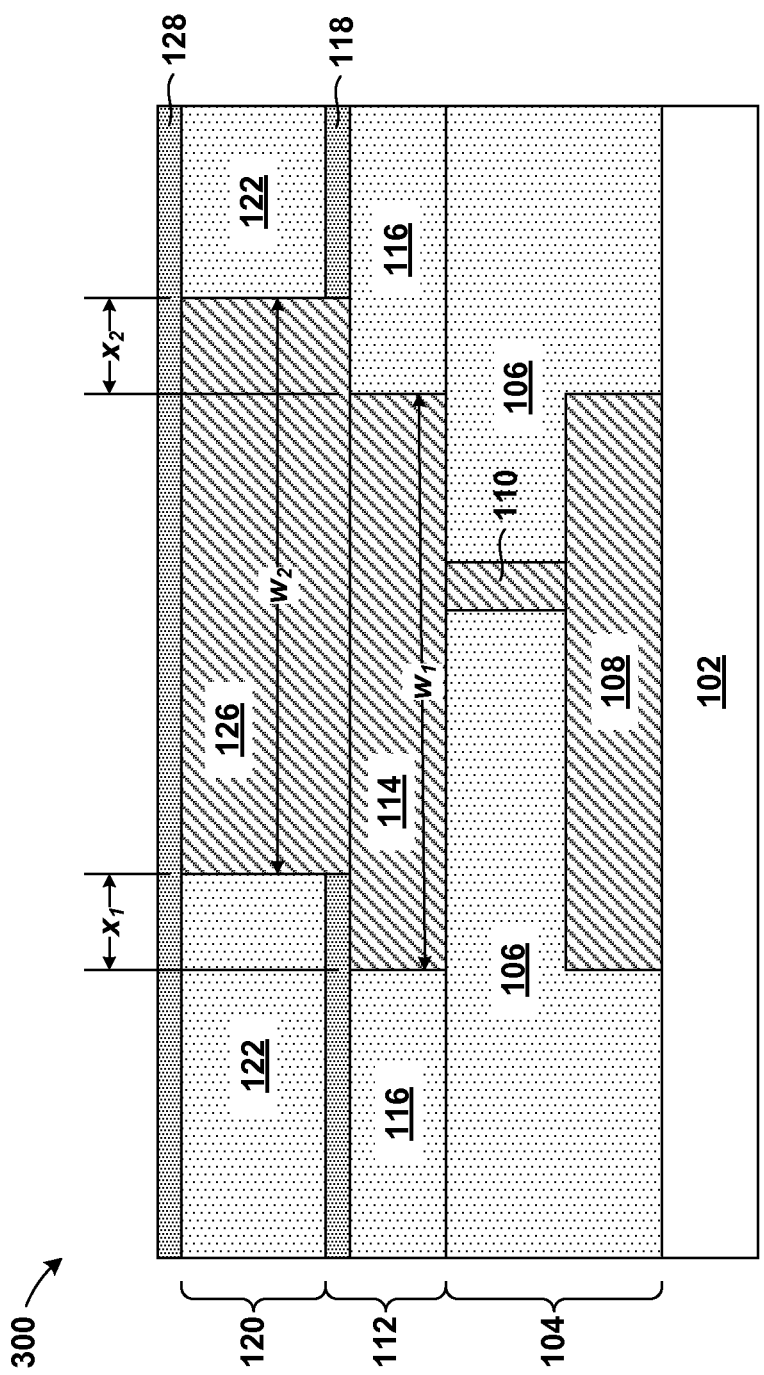
FIG. 5 is a cross section view illustrating a final structure according to another exemplary embodiment.

Referring now to FIG. 5, a final structure 300 is shown according to another embodiment. The structure 300 may be substantially similar in all respects to the structure 100 described in detail above; however, in the present embodiment, the sides of the upper metal wire are offset from the sides of the lower metal wire such that the upper metal wire is offset from the lower metal wire, as shown.

In the present embodiment, the vertical sides of the second metal wire 126 may be offset from the vertical sides of the first metal wire 114 by a predetermined distance ($x_1$, $x_2$), as described above. Unlike embodiments described above, a portion of the second dielectric layer 122 and the first cap dielectric 118 may remain above the first metal wire 114 at one end of the second metal wire 126, and a portion of the second metal wire 126 may extend above a portion of the first dielectric 116 at another end of the second metal wire 126. Again, the potential for cracking and failure is reduced by offsetting the vertical sidewalls of two adjacent metal wires stacked one on top of the other.

The inductors illustrated in FIGS. 3, 4 and 5 may each be referred to as a dual-metal inductor. The same principles described above may also be applied to the fabrication of a tri-metal inductor in which three metal wires are stacked one on top of another. In the case of a tri-metal inductor the metal wires may have any width so long as the vertical sides of one metal wire are offset from the vertical sides of an immediately adjacent metal wire, as described above. An example of a tri-metal inductor is described below with reference to FIG. 6. Also, the inductors illustrated in FIG. 3, 4, 5 or 6 may have a spiral configuration, but may alternatively have some configuration other than a spiral, for example a rectangle, a square, or an octagon as is well known in the art.

Figure 6:
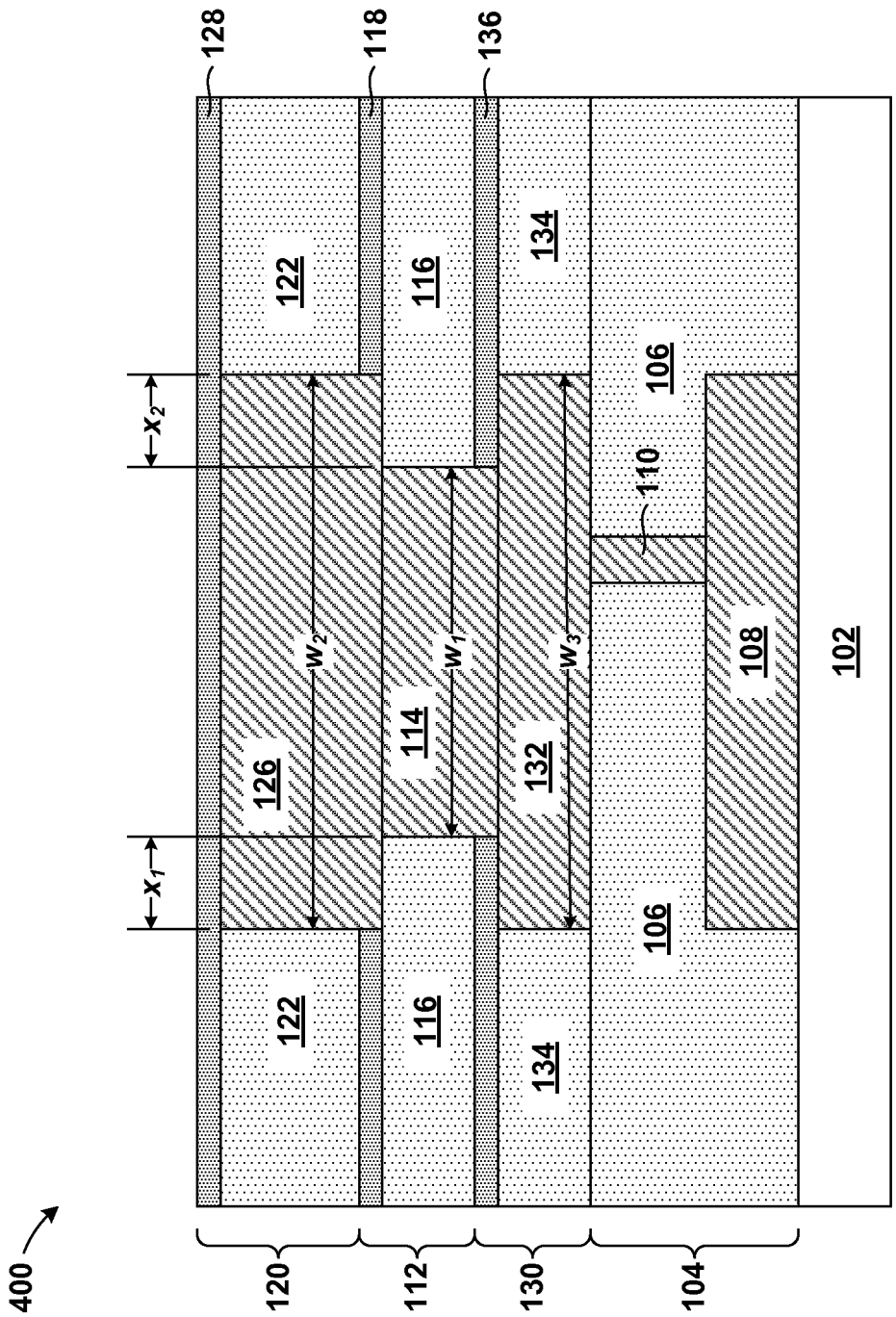
FIG. 6 is a cross section view illustrating a final structure according to another exemplary embodiment.

Referring now to FIG. 6, a final structure 400 is shown according to another embodiment. The structure 400 may be substantially similar in all respects to the structure 100 described in detail above; however, in the present embodiment, a third inductor level 130 may be formed below the first inductor level 112, as shown. The third inductor level 130 may include a third metal wire 132 formed in a third dielectric layer 134, and a third cap dielectric 136. The third inductor level 130 may be substantially similar to either the first or second inductor levels 112, 120, described above. In one embodiment, the third dielectric layer 134 may have a thickness ranging from about 0.5 μm to about 8 μm.

Like the first and second metal wires 114, 126 above, a third metal wire 132 may be formed in the third dielectric layer 134 in accordance with typical lithography techniques, as described in more detail above with reference to the first and second metal wires 114, 126. A chemical mechanical polishing technique may be applied to remove excess conductive interconnect material prior to depositing the third cap dielectric 136 above the third metal wire 132 and above the third dielectric layer 134. The third cap dielectric 136 may electrically insulate the third inductor level 130 from the first inductor level 112 above. The third cap dielectric 136 may be substantially similar to the first and second cap dielectrics 118, 128 and may be deposited using a similar technique.

In one embodiment, a typical width of either the first, second, or third metal wires 114, 126, 132 for example ($w_1$), ($w_2$), or ($w_3$) may range from about 2 μm to about 50 μm. It should be noted however, that the width ($w_1$) of the first metal wire 114 may be different than the width ($w_2$) of the second metal wire 126 as is described in detail above. In some embodiments, the width ($w_2$) of the second metal wire 126 may be either wider or narrower than the width ($w_1$) of the first metal wire 114, as detailed above. Generally, the width ($w_3$) of the third metal wire 132 may be any size relative to the width ($w_1$) of the first metal wire 114, and is not critical to the various embodiments of the present invention.

In the present embodiment, the vertical sides of the second metal wire 126 may be offset from the vertical sides of the first metal wire 114 in accordance with description above with reference to FIGS. 1-4.

The stacked metal wires of the structure 400, for example the first, second, and third metal wires 114, 126, 132, may together form a single thicker wire which may be implemented to improve the efficiency and capabilities of an inductor. The first, second, and third metal wires 114, 126, 132 may represent any three metal wires in the stack of metal wires of an inductor.

In one embodiment, the first, second, and third dielectric layers 116, 122, 134 may have different thickness. For example, the first dielectric layer 116 may have a thickness ranging from about 0.5 μm to about 4 μm, the second dielectric layer 122 may have a thickness ranging from about 3 μm to about 8 μm, and the third dielectric layer 134 may have a thickness ranging from about 0.5 μm to about 4 μm. Therefore, the first, second, and third metal wires 114, 116, 132 may also have different thicknesses which may correspond to the thicknesses of the first, second, and third dielectric layers 116, 122, 134. In one embodiment, the first metal wire 114 may preferably be thinner than the second metal wire 126, and the third metal wire 132 may preferably be thinner than the second metal wire 126.

Figure 7:
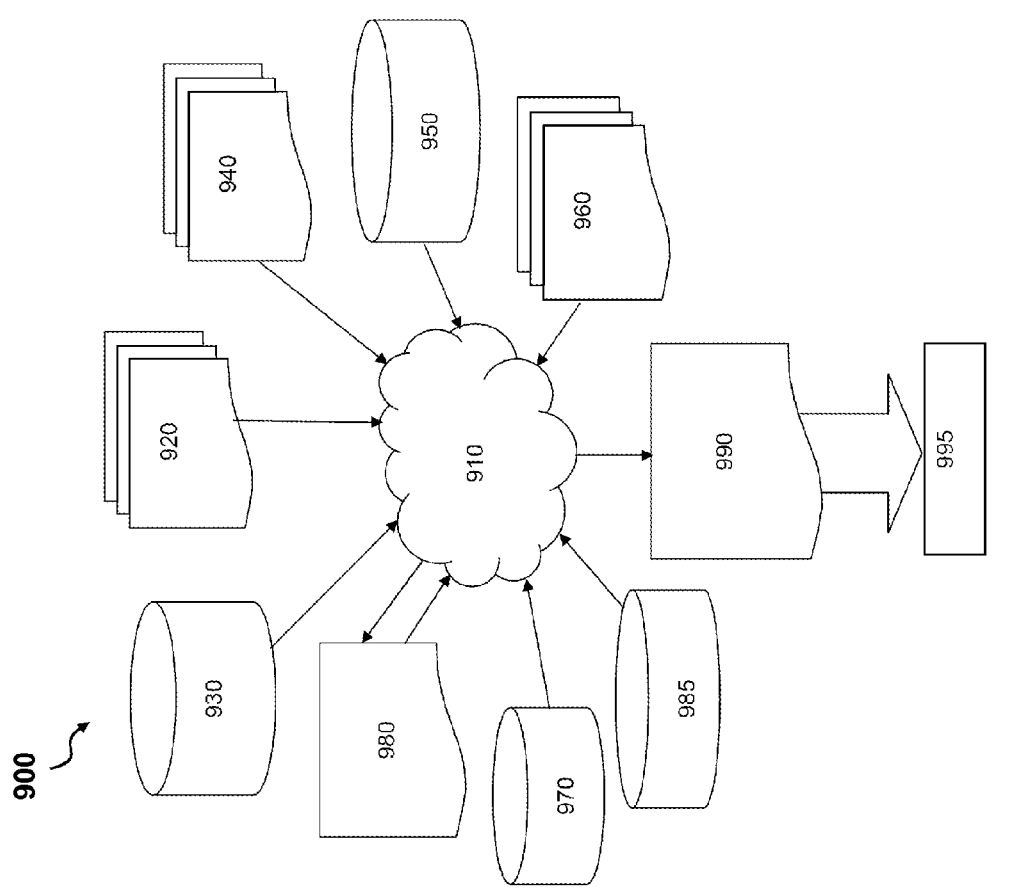
FIG. 7 is a flow diagram of a design process used in semiconductor design, manufacture, and/or test.

Now referring to FIG. 7 a block diagram of an exemplary design flow 900 used, for example, in semiconductor IC logic design, simulation, test, layout, and manufacture, is shown. The design flow 900 includes processes, machines and/or mechanisms for processing design structures or devices to generate logically or otherwise functionally equivalent representations of the design structures and/or devices described above and shown in FIGS. 1-6. The design structures processed and/or generated by the design flow 900 may be encoded on machine readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e beam writers), computers or equipment for simulating design structures, any apparatus used in the manufacturing or test process, or any machines for programming functionally equivalent representations of the design structures into any medium (e.g. a machine for programming a programmable gate array).

The design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 920 that is preferably processed by a design process 910. The design structure 920 may be a logical simulation design structure generated and processed by the design process 910 to produce a logically equivalent functional representation of a hardware device. The design structure 920 may also or alternatively comprise data and/or program instructions that when processed by the design process 910, generate a functional representation of the physical structure of a hardware device. Whether representing functional and/or structural design features, the design structure 920 may be generated using electronic computer-aided design (ECAD) such as implemented by a core developer/designer. When encoded on a machine-readable data transmission, gate array, or storage medium, the design structure 920 may be accessed and processed by one or more hardware and/or software modules within the design process 910 to simulate or otherwise functionally represent an electronic component, circuit, electronic or logic module, apparatus, device, or system such as those shown in FIGS. 1-6. As such, the design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

The design process 910 preferably employs and incorporates hardware and/or software modules for synthesizing, translating, or otherwise processing a design/simulation functional equivalent of the components, circuits, devices, or logic structures shown in FIGS. 1-6 to generate a Netlist 980 which may contain design structures such as the design structure 920. The Netlist 980 may include, for example, compiled or otherwise processed data structures representing a list of wires, discrete components, logic gates, control circuits, I/O devices, models, etc. that describes the connections to other elements and circuits in an integrated circuit design. The Netlist 980 may be synthesized using an iterative process in which the Netlist 980 is resynthesized one or more times depending on design specifications and parameters for the device. As with other design structure types described herein, the Netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

The design process 910 may include hardware and software modules for processing a variety of input data structure types including the Netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. The design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in the design process 910 without deviating from the scope and spirit of the invention. The design process 910 may also include modules for performing standard circuit design processes such as timing analysis, verification, design rule checking, place and route operations, etc.

The design process 910 employs and incorporates logic and physical design tools such as HDL compilers and simulation model build tools to process the design structure 920 together with some or all of the depicted supporting data structures along with any additional mechanical design or data (if applicable), to generate a second design structure 990. The second design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to the design structure 920, the second design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-6. In one embodiment, the second design structure 990 may comprise a compiled, executable HDL simulation model that functionally simulates the devices shown in FIGS. 1-6.

The second design structure 990 may also employ a data format used for the exchange of layout data of integrated circuits and/or symbolic data format (e.g. information stored in a GDSII (GDS2), GL1, OASIS, map files, or any other suitable format for storing such design data structures). The second design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-6. The second design structure 990 may then proceed to a stage 995 where, for example, the second design structure

990: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method of forming an inductor, the method comprising:
    forming a first metal wire of the inductor in a first trench in a first dielectric layer of a first inductor level, the first metal wire having a first vertical side and a second vertical side opposite the first vertical side and the first metal wire further having a first width as measured from the first vertical side to the second vertical side, the first metal wire being electrically connected to a lower wire in a lower wiring level through a via, the lower wire of the lower wiring level and the first metal wire of the first inductor level having approximately equal widths and being wider than the via;
    forming a second dielectric layer of a second inductor level above the first metal wire and the first dielectric layer;
    forming a second trench that extends vertically through the second dielectric layer and that is partially offset from the first metal wire; and
    forming a second metal wire of the inductor in the second trench,
        the second metal wire being thicker than the first metal wire,
        the second metal wire having a third vertical side and a fourth vertical side opposite the third vertical side,
        the second metal wire having a second width as measured from the third vertical side to the fourth vertical side,
        the second width being approximately equal to the first width, and
        the first vertical side being laterally offset from the third vertical side by a first offset distance and the second vertical side being laterally offset from the fourth vertical side by a second offset distance that is approximately equal to the first offset distance such that the third vertical side extends vertically from the first metal wire to a top surface of the second dielectric layer and such that the fourth vertical side extends vertically from the first dielectric layer to the top surface of the second dielectric layer.

2. The method of claim 1, the forming of the first metal wire in the first trench in the first dielectric layer comprising:
    forming the first trench in the first dielectric layer; and
    depositing a first conductive interconnect material within the first trench to form the first metal wire.

3. The method of claim 1, the forming of the second metal wire in the second trench comprising:
    forming the second trench in the second dielectric layer such that one end of the second trench is above the first metal wire and an opposite end of the second trench extends laterally beyond the first metal wire over the first dielectric layer; and
    depositing a second conductive interconnect material within the second trench to form the second metal wire.

4. The method of claim 1, further comprising:
    forming a first cap dielectric above the first metal wire and the first dielectric layer, the second metal wire being formed in the second dielectric layer and the first cap dielectric; and
    forming a second cap dielectric above the second metal wire and the second dielectric layer, the first cap dielectric comprising any of silicon carbon nitride and hydrogenated silicon carbide.

5. The method of claim 4, further comprising:
    before forming the first metal wire in the first trench in the first dielectric layer, forming a third metal wire in a third dielectric layer and forming the first dielectric layer on the third dielectric layer, the first metal wire being formed such that the third metal wire and the first metal wire are in direct contact with one another.

6. The method of claim 5, further comprising:
    before the forming of the first dielectric layer, forming a third cap dielectric above the third metal wire and the third dielectric layer, the first metal wire being formed in the first dielectric layer and the third cap dielectric and between the first dielectric layer and the third dielectric layer.

7. The method of claim 1, the first offset distance and the second offset distance each being at least approximately 0.6 µm.

8. An inductor comprising:
    a first metal wire of the inductor in a first trench in a first dielectric layer of a first inductor level, the first metal wire having a first vertical side and a second vertical side opposite the first vertical side and the first metal wire further having a first width as measured from the first vertical side to the second vertical side, the first metal wire being electrically connected to a lower wire in a lower wiring level through a via, the lower wire of the lower wiring level and the first metal wire of the first inductor level having approximately equal widths and being wider than the via;
    a second dielectric layer of a second inductor level above the first metal wire and the first dielectric layer;
    a second trench that extends vertically through the second dielectric layer and that is partially offset from the first metal wire; and
    a second metal wire of the inductor in the second trench,
        the second metal wire having a third vertical side and a fourth vertical side opposite the third vertical side,
        the second metal wire being thicker than the first metal wire,
        the second metal wire having a second width as measured from the third vertical side to the fourth vertical side,
        the second width being approximately equal to the first width, and
        the first vertical side being laterally offset from the third vertical side by a first offset distance and the second vertical side being laterally offset from the fourth vertical side by a second offset distance that is approximately equal to the first offset distance such that the third vertical side extends vertically from the first metal wire to a top surface of the second dielectric layer and such that the fourth vertical side extends vertically from the first dielectric layer to the top surface of the second dielectric layer.

9. The inductor of claim 8, further comprising: a cap dielectric between the first dielectric layer and the second dielectric layer, the second metal wire being in the second dielectric layer and the cap dielectric, the cap dielectric comprising any of silicon carbon nitride and hydrogenated silicon carbide.

10. The inductor of claim 8, further comprising:
a third metal wire in a third dielectric layer directly below the first metal wire, the first metal wire and the third metal wire being in direct contact with one another.

11. The inductor of claim 10, further comprising:
a cap dielectric between the first dielectric layer and the third dielectric layer, the first metal wire being in the first dielectric layer and the cap dielectric, the cap dielectric comprising any of silicon carbon nitride and hydrogenated silicon carbide.

12. The inductor of claim 8, the first metal wire and the second metal wire together forming a thick inductor wire.

13. The inductor of claim 8, the first offset distance and the second offset distance each being at least approximately 0.6 μm.

14. A design structure tangibly embodied in a machine readable medium for designing, manufacturing, or testing an integrated circuit, the design structure comprising:
a first metal wire of an inductor in a first trench in a first dielectric layer of a first inductor level, the first metal wire having a first vertical side and a second vertical side opposite the first vertical side and the first metal wire having a first width as measured from the first vertical side to the second vertical side, the first metal wire being electrically connected to a lower wire in a lower wiring level through a via, the lower wire of the lower wiring level and the first metal wire of the first inductor level having approximately equal widths and being wider than the via;
a second dielectric layer of a second inductor level above the first metal wire and the first dielectric layer;
a second trench that extends vertically through the second dielectric layer and that is partially offset from the first metal wire; and
a second metal wire of the inductor in the second trench, the second metal wire having a third vertical side and a fourth vertical side opposite the third vertical side,
the second metal wire being thicker than the first metal wire,
the second metal wire having a second width as measured from the third vertical side to the fourth vertical side,
the second width being approximately equal to the first width, and
the first vertical side being laterally offset from the third vertical side by a first offset distance and the second vertical side being laterally offset from the fourth vertical side by a second offset distance that is approximately equal to the first offset distance such that the third vertical side extends vertically from the first metal wire to a top surface of the second dielectric layer and such that the fourth vertical side extends vertically from the first dielectric layer to the top surface of the second dielectric layer.

* * * * *